United States Patent
Kaneko

(10) Patent No.: US 6,381,832 B1
(45) Date of Patent: *May 7, 2002

(54) PROCESS FOR THE PRODUCTION OF A SUPERCONDUCTING WIRE HAVING A STACKED STRUCTURE

(75) Inventor: Norio Kaneko, Atsugi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/645,064

(22) Filed: May 13, 1996

(30) Foreign Application Priority Data

May 11, 1995 (JP) .............................. 7-135626

(51) Int. Cl.[7] .............................................. H01L 39/24
(52) U.S. Cl. ...................... 29/599; 505/230; 505/231; 505/236; 505/237; 505/430; 505/431; 505/432
(58) Field of Search ........................... 29/599; 505/230, 505/231, 236, 237, 239, 430, 431, 432, 433, 434, 450, 452

(56) References Cited

U.S. PATENT DOCUMENTS

| | | | | |
|---|---|---|---|---|
| 4,952,554 A | * | 8/1990 | Jin et al. ...................... 505/230 |
| 5,030,616 A | * | 7/1991 | Yamamoto et al. .......... 505/433 |
| 5,059,582 A | * | 10/1991 | Chung ..................... 505/236 X |
| 5,063,200 A | * | 11/1991 | Okada et al. |
| 5,075,286 A | * | 12/1991 | Powell et al. .............. 29/599 X |
| 5,091,362 A | * | 2/1992 | Ferrando .................... 505/452 |
| 5,102,864 A | * | 4/1992 | Rapp et al. .................. 505/452 |
| 5,147,849 A | * | 9/1992 | Tanaka et al. .......... 505/236 X |
| 5,204,318 A | * | 4/1993 | Yurek et al. ................. 505/452 |
| 5,252,549 A | * | 10/1993 | Yamaguchi et al. ....... 29/599 X |
| 5,512,542 A | | 4/1996 | Den et al. .................... 505/125 |
| 5,552,370 A | * | 9/1996 | Anderson et al. ........ 505/236 X |
| 5,744,427 A | * | 4/1998 | Torii ........................ 29/599 X |

FOREIGN PATENT DOCUMENTS

| | | | |
|---|---|---|---|
| EP | 0704862 A2 | 4/1996 | |
| JP | 63241826 | 10/1988 | ........... H01B/13/00 |
| JP | 1276516 | 11/1989 | ........... H01B/13/00 |
| JP | 2-37623 | 2/1990 | ........... H01B/13/00 |

OTHER PUBLICATIONS

Patent Abstracts of Japan, vol. 14, No. 470 (C–0769) Jul. 30, 1990.
Patent Abstracts of Japan, vol. 17, No. 450 (E–1416) Apr. 23, 1993.

* cited by examiner

Primary Examiner—Carl J. Arbes
(74) Attorney, Agent, or Firm—Fitzpatrick, Cella, Harper & Scinto

(57) ABSTRACT

A superconducting wire having a stacked structure comprising (a) a substrate composed of an electrically conductive material, (b) an oxide superconductor material, and (c) an electrically conductive material which is substantially not reactive with said oxide superconductor material (b), wherein said electrically conductive material (c) is impregnated in said oxide superconductor material (b) by way of heat fusion such that gaps among crystal grains contained in said oxide superconductor material (b) are filled with said electrically conductive material (c). And a process for the production of said superconducting wire.

13 Claims, 4 Drawing Sheets

PROCESS FOR THE PRODUCTION OF A SUPERCONDUCTING WIRE HAVING A STACKED STRUCTURE

BACKGROUND OF THE INVENTION

1. Field of the Invention

The present invention relates to a superconducting wire having a stacked structure comprising an electrically conductive substrate, an oxide superconductor, and an electrically conductive material which is substantially not reactive with said oxide superconductor wherein said electrically conductive material is impregnated in said oxide superconductor such that said electrically conductive material fills gaps among crystal grains in said oxide superconductor while reaching the interface between said substrate and said oxide superconductor, which is suitable for use in various superconducting magnets and coils. The present invention also relates to a process for the production of said superconducting wire.

2. Related Background Art

There are known so-called Y-series oxide superconductors and so-called Bi-series oxide superconductors which exhibit a superconductivity at a temperature which is higher than the boiling point of liquid nitrogen. As for the production of a wire of any of these superconductors, there are know the following two manners: manner 1 comprising charging a metal tube with a superconducting material or a raw material capable of providing a superconducting material and subjecting the resultant to wire drawing, wherein if necessary, heat treatment is conducted before or after the wire drawing processing, to obtain a wire; and manner 2 comprising forming a film comprising an oxide superconductor on a tape-like shaped substrate by way of a thin film-forming process such as a sputtering process to obtain a wire.

However, as for these oxide superconductors, there are problems such that they are inferior in workability, i.e., they cannot be easily processed as metals; and in the case of subjecting them to wire drawing by means of rolling or dies, gaps are liable to occur among their crystal grains because the crystal grains are difficult to be deformed.

In addition, in the case of producing of a wire of such oxide superconductor in accordance the foregoing manner 1, problems are liable to entail in that when the metal tube is not charged with the oxide superconductor in such a state that the inside of the metal tube is entirely and uniformly filled with the oxide superconductor, the resulting wire becomes such that is practically not usable, and in addition, upon cooling the metal tube having the oxide superconductor contained therein, a reduction is caused in the contact of the oxide superconductor with the metal tube, wherein the resulting wire eventually becomes to be not usable in practice.

In order to eliminate the foregoing problems in the prior art, Japanese Unexamined Patent Publication No. 37623/1990 (hereinafter referred to as "document 1") proposes a manner of charging an aluminum tube with an oxide superconductor to obtain a composite body comprising the aluminum tube charged with the oxide superconductor, and subjecting the composite body to heat treatment at a temperature of 900 to 1000° C. wherein the aluminum of the composite body is molten away to expose the oxide superconductor which is followed by being sintered. In document 1, there is described that according to this manner, the oxygen content of the oxide superconductor can be controlled as desired and the occurrence of gaps among the crystal grains of the oxide superconductor can be prevented.

Similarly, Japanese Unexamined Patent Publication No. 276516/1989 (hereinafter referred to as "document 2") proposes a manner of inserting a compact of an oxide superconductor in a silver tube and charging silver powder in the silver tube such that a clearance present between the oxide superconductor and the silver tube is filled with the silver powder. In document 2, there is described that according to this manner, an improvement can be attained in the contact of the oxide superconductor with the silver tube.

Further, Japanese Unexamined Patent Publication No. 241826/1988 (hereinafter referred to as "document 3") proposes a manner providing a wire-drawn substrate having a surface comprised of a copper material or copper alloy material, forming a thin film composed of a superconducting material on the surface of the substrate by means of a thin film-forming process and subjecting the resultant to heat treatment. In document 3, there is described that being somewhat different depending upon the kind of the superconducting material, the heat treatment is usually conducted at a temperature of 800 to 1000° C. for a period of time of 1 to 100 hours.

However, any of the manners described in documents 1 to 3 has still problems required to be solved. Particularly, in the case of the manner disclosed in document 1, because aluminum is of a melting point of about 660° C., when the composite body comprising the aluminum tube charged with the oxide superconductor is heat-treatet at a temperature of 900 to 1000° C., it is extremely likely that the aluminum of the composite body is oxidized with the oxygen contained in the oxide superconductor before it is removed from the oxide superconductor. Particularly, in the method described in document 1, there are aluminum materials embedded in the recesses or grain boundaries present at the surface of the oxide superconductor, and as for these aluminum materials, there is a tendency that they are remained without being removed and oxidized with the oxygen contained in the oxide superconductor to cause the precipitation of aluminum oxide materials as impurities at the surface of the oxide superconductor, wherein there is a tendency for the aluminum oxide materials thus precipitated to react with the oxide superconductor to make the oxide superconductor to have a reduced critical current density. Hence, according to the manner described in document 1, although the occurrence of gaps among the crystal grains of the oxide superconductor could be prevented due to the aluminum materials embedded in the recesses or grain boundaries present at the surface of the oxide superconductor, but a problem is liable to entail in that the resulting wire composed of the oxide superconductor becomes to be insufficient in critical current density. Now, document 1 does not suggest anything about the formation of a stabilizing material which is essential in the case of a superconducting magnet.

According to the manner described in document 2, it is understood that the contact between the oxide superconductor and the silver tube due to the presence of the silver powder between them could be improved. But document 2 does not suggest anything not only about the prevention of the occurrence of gaps among the crystal grains of the oxide superconductor but also about the improvement of the resulting superconducting wire in terms of critical current density.

As for the manner described in document 3, there is a problem in that the production of a superconducting wire cannot be conducted at a desirably high production speed because such long period of time as above described is required in the heat treatment. In addition, there is also a problem in that since the formation of the superconducting material is conducted by the thin film-forming process, it is necessary to precisely control the composition of elements constituting the superconducting material upon the film formation wherein a slight variation in said composition upon the film formation makes the resulting superconducting material to greatly varied in superconducting characteristics, and because of this, it is almost impossible to produce a long superconducting wire having uniform superconducting characteristics.

As apparent from the above description, according to any of the conventional manners, there cannot be effectively realized a high quality superconducting wire having uniform superconducting characteristics and which is free of a reduction in the critical temperature, always exhibits an excellent current density and excels in mechanical strength.

SUMMARY OF THE INVENTION

An object of the present invention is to solve the foregoing problems in the prior art of producing a superconducting wire and to make it possible to effectively produce a high quality superconducting wire with no reduction in critical temperature and which always exhibits superconductor having a high critical temperature.

Another object of the present invention is to provide a superconducting wire having uniform superconducting characteristics and which is free of a reduction in the critical temperature, always exhibits an excellent critical current density and excels in mechanical strength, said superconducting wire having a stacked structure comprising (a) an electrically conductive substrate, (b) a layer composed of an oxide superconductor having a high critical temperature and (c) a layer composed of an electrically conductive material which is substantially not reactive with the oxide superconductor of said layer (b), wherein the electrically conductive material of said layer (c) is impregnated in said layer (b) such that the electrically conductive material of the layer (c) fills gaps among the crystal grains in the layer (b) while reaching the interface between the substrate (a) and the layer (b).

A further object of the present invention is to provide a superconducting wire having uniform characteristics and which is free of a reduction in the critical temperature, always exhibits an excellent critical current density and excels in mechanical strength, said superconducting wire having a stacked structure comprising (b) a layer composed of an oxide superconductor having a high critical temperature interposed between (a) a tape-like shaped electrically conductive substrate and (c) a tape-like shaped layer composed of an electrically conductive material which is substantially not reactive with the oxide superconductor of said layer (b), wherein the electrically conductive material of said layer (c) is impregnated in said layer (b) such that the electrically conductive material of the layer (c) fills gaps among the crystal grains in the layer (b) while reaching the interface between the substrate (a) and the layer (b).

A further object of the present invention is to provide a superconducting wire having uniform superconducting characteristics and which is free of a reduction in the critical temperature, always exhibits an excellent critical current density and excels in mechanical strength, said superconducting wire having a stacked structure comprising (a) a tublar electrically conductive substrate, (c) a layer composed of an electrically conductive material disposed to cover the inner wall face of said tublar electrically conductive substrate such that said tublar electrically conductive substrate has a core space, and (b) a layer composed of an oxide superconductor having a high critical temperature disposed to fill said core space of said tublar electrically conductive substrate, said electrically conductive material of said layer (c) being substantially not reactive with said oxide superconductor of said layer (c), wherein the electrically conductive material of said layer (c) is impregnated in said layer (b) such that the electrically conductive material of the layer (c) fills gaps among the crystal grains in the layer (b) while reaching the interface between the substrate (a) and the layer (b).

A further object of the present invention is to provide a process for producing a superconducting wire having uniform superconducting characteristics and which is free of a reduction in the critical temperature, always exhibits an excellent critical current density and excels in mechanical strength, said process comprising the steps of: providing a stacked body comprising (a) an electrically conductive substrate, (b) a layer composed of an oxide superconductor having a high critical temperature and (c) a layer composed of an electrically conductive material which is substantially not reactive with said oxide superconductor of said layer (b); subjecting said stacked body to heat treatment to fuse said layer (c) to impregnate in said layer (b) such that the electrically conductive material of the layer (c) fills gaps among the crystal grains in the layer (b) while reaching the interface between the substrate (a) and the layer (b).

DESCRIPTION OF THE INVENTION AND PREFERRED EMBODIMENTS

Figure 1A:
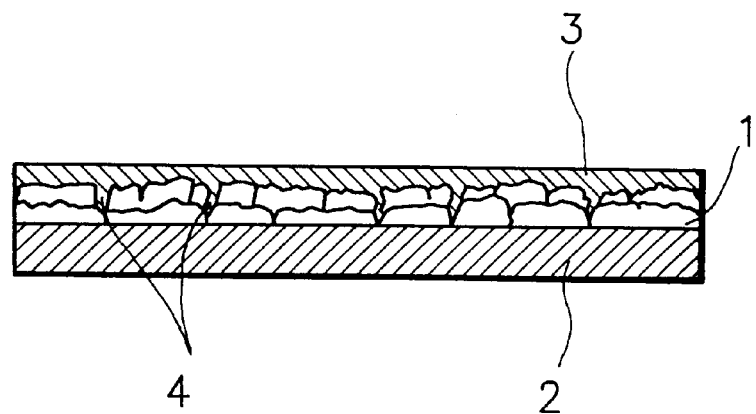
FIG. 1(A) is a schematic cross-sectional view illustrating an example of a tape-like shaped superconducting wire according to the present invention.

The present invention provides a high quality superconducting wire having uniform superconducting characteristics and which is free of a reduction in the critical temperature, always exhibits an excellent critical current density and excels in mechanical strength.

Particularly, a typical embodiment of the superconducting wire according to the present invention comprises a stacked structure comprising (a) an electrically conductive substrate, (b) a layer composed of an oxide superconductor having a high critical temperature and (c) a layer composed of an electrically conductive material which is substantially not reactive with said oxide superconductor of said layer (b), said electrically conductive material of said layer (c) being impregnated in said layer (b) by way of heat fusion such that the electrically conductive material of the layer (c) fills gaps among the crystal grains in the layer (b) while reaching the interface between the substrate (a) and the layer (b). In the superconducting wire, the oxide superconductor is well fixed with the substrate with a sufficient contact by virtue of the electrically conductive material impregnated in the oxide superconductor such that the electrically conductive material fills the gaps among the crystal grains in the oxide superconductor layer while reaching the interface between the substrate and the oxide superconductor layer. Because of this, the superconducting wire has uniform superconducting characteristics, and it is free of a reduction in the critical temperature, always exhibits an excellent critical current density and excels in mechanical strength.

Now, as the oxide superconductor, it is desirable to use an oxide superconductor having a single crystal structure. However, it is difficult to stably acquire a long oxide superconductor having a single crystal structure along the entire length thereof which is required to be used in the production of a superconducting wire which is required to have a long length. According to the present invention, it is possible to attain a high quality superconducting wire even in the case where a long oxide superconductor containing crystal grains is used.

Another typical embodiment of the superconducting wire according to the present invention comprises a stacked structure comprising (b) a layer composed of an oxide superconductor having a high critical temperature interposed between (a) a tape-like shaped electrically conductive substrate and (c) a tape-like shaped layer composed of an electrically conductive material which is substantially not reactive with the oxide superconductor of said layer (b), wherein the electrically conductive material of said layer (c) is impregnated in said layer (b) by way of heat fusion such that the electrically conductive material of the layer (c) fills gaps among the crystal grains present in the layer (b) while reaching interface between the substrate (a) and the layer (b).

A further typical embodiment of the superconducting wire according to the present invention comprises a stacked structure comprising (a) a tublar electrically conductive substrate, (c) a layer composed of an electrically conductive material disposed to cover the inner wall face of said tublar substrate such that the tublar substrate has a core space, and (b) a layer composed of an oxide superconductor having a high critical temperature disposed to fill said core space of the tublar substrate, the electrically conductive material of said layer (c) being substantially not reactive with the oxide superconductor of said layer (b), wherein the electrically conductive material of the layer (c) is impregnated in the layer (b) by way of heat fusion such that the electrically conductive material of the layer (c) fills gaps among the crystal grains in the layer (b) while reaching the interface between the substrate (a) and the layer (b).

The present invention provides a process for the production of a superconducting wire having uniform superconducting characteristics and which is free of a reduction in the critical temperature, always exhibits an excellent critical current density and excels in mechanical strength.

A typical embodiment of the process according to the present invention comprises the steps of: providing a stacked body comprising (a) an electrically conductive substrate, (b) a layer composed of an oxide superconductor having a high critical temperature and (c) a layer composed of an electrically conductive material which is substantially not reactive with the oxide superconductor of said layer (b); subjecting said stacked body to heat treatment to fuse said layer (c) to impregnate in said layer (b) such that the electrically conductive material of the layer (c) fills gaps among the crystal grains of said layer (b) while reaching the the interface between the substrate (a) and the layer (b).

In the following, the present invention will be detailed while referring to the drawings.

FIG . 1(A) is a schematic cross-sectional view illustrating an example of a tape-like shaped superconducting wire according to the present invention. FIG. 1(B) is a schematic cross-sectional view illustrating an example of a sheath-like shaped superconducting wire according to the present invention.

Figure 1B:
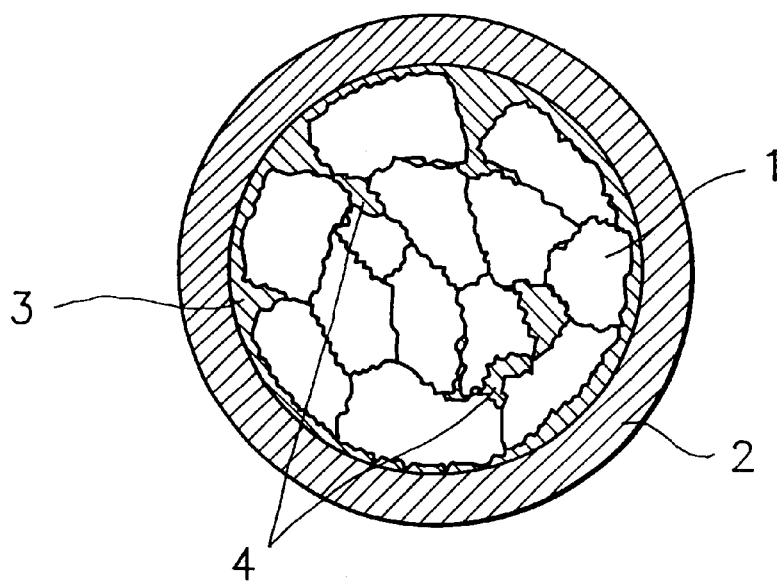
FIG. 1(B) is a schematic cross-sectional view illustrating an example of a sheath-like shaped superconducting wire according to the present invention.

In FIGS. 1(A) and 1(B), numeral reference 1 indicates an oxide superconductor. Numeral reference 2 indicates a substrate composed of an electrically conductive material which also functions as a stabilizer for the oxide superconductor 1 (specifically, as a path for an electric current from the oxide superconductor 1 in case of emergency such as quench of the superconductor). In the case of FIG. 1(A), the substrate 2 comprises a tape-like shaped material made of a metal or alloy, and in the case of FIG. 1(B), the substrate 2 comprises a hollow tube made of a metal or alloy. Numeral reference 3 indicates an electrically conductive material comprising a metal or alloy which is substantially not reactive with the oxide superconductor 1. The electrically conductive material 3 functions as a stabilizer for the oxide superconductor 1. Numeral reference 4 indicates a gap present among the crystal grains of the oxide superconductor 1. In any of the superconducting wires shown in FIGS. 1(A) and 1(B), the electrically conductive material 3 is impregnated in the oxide superconductor such that the gaps 4 of the oxide superconductor are filled with the electrically conductive material.

Now, in the production of a superconducting wire having a long length, a conventional long oxide superconductor containing crystal grains is usually used, because it is almost impossible to stably acquire a long oxide superconductor having a single crystal structure along the entire length thereof. When the long oxide superconductor containing crystal grains is subjected to wire-drawing in the production of a superconducting wire, gaps are unavoidably occurred at the oxide superconductor due to the crystal grains present therein. And it is almost impossible to prevent the occurrence of said gaps by means of the current technique. The presence of such gaps in the oxide superconductor entail such problems as will be described in the following. That is, for instance, when carbonic acid gas or the like is contaminated into the gaps-bearing oxide superconductor during the process of producing a superconductive wire, there entails a problem of causing a chemical change in the oxide superconductor. Separately, as for the superconducting wire having the gaps-bearing oxide superconductor, there are drawbacks such that no electric current is flown through the gaps and therefore, the quantity of electric current through the superconducting wire is undesirably small; and the crystal grains are present in the oxide superconductor without being immobilized and the oxide superconductor is contacted with the electrically conductive substrate with an insufficient adhesion and because of this, the superconducting wire is poor in mechanical strength.

However, the superconducting wire according to the present invention is free of these problems even when it is produced using such long oxide superconductor containing crystal grains. That is, in the superconducting wire according to the present invention, as apparent from FIGS. 1(A) and 1(B), the gaps 4 among the crystal grains present in the oxide superconductor 1 are filled with the electrically conductive material 3 (comprising a metal or alloy which is substantially not reactive with the oxide superconductor) impregnated in the oxide superconductor 1 while reaching the interface between the substrate 2 and the oxide superconductor 1, wherein not only the crystal grains are sufficiently immobilized but also the oxide superconductor 1 is well fixed with the substrate 2 with a sufficient adhesion by virtue of the electrically conductive material 3 impregnated in the oxide superconductor while reaching the interface between the substrate 2 and the oxide superconductor. Because of this, the superconducting wire excels particularly in mechanical strength.

In the present invention, the impregnation of a given metal or alloy as the electrically conductive material 3 (which is substantially not reactive with the oxide superconductor 1) in the oxide superconductor 1 may be conducted by way of heat fusion. In this case, there is a tendency for the metal or ally as the electrically conductive material 3 to be partly dispersed into the crystal grains of the oxide superconductor 1. In this case, the metal or alloy thus dispersed functions as a pinning center to provide an improvement in the critical current density exhibited by the superconducting wire.

As the metal or alloy as the electrically conductive material 3 in the present invention, any metals and alloys may be optionally used as long as they are substantially not reactive with the oxide superconductor and have a melting point which is lower than the decomposition temperature of the oxide superconductor.

In the following, description will be made of the process for the production of a superconducting wire according to the present invention.

Figure 2:
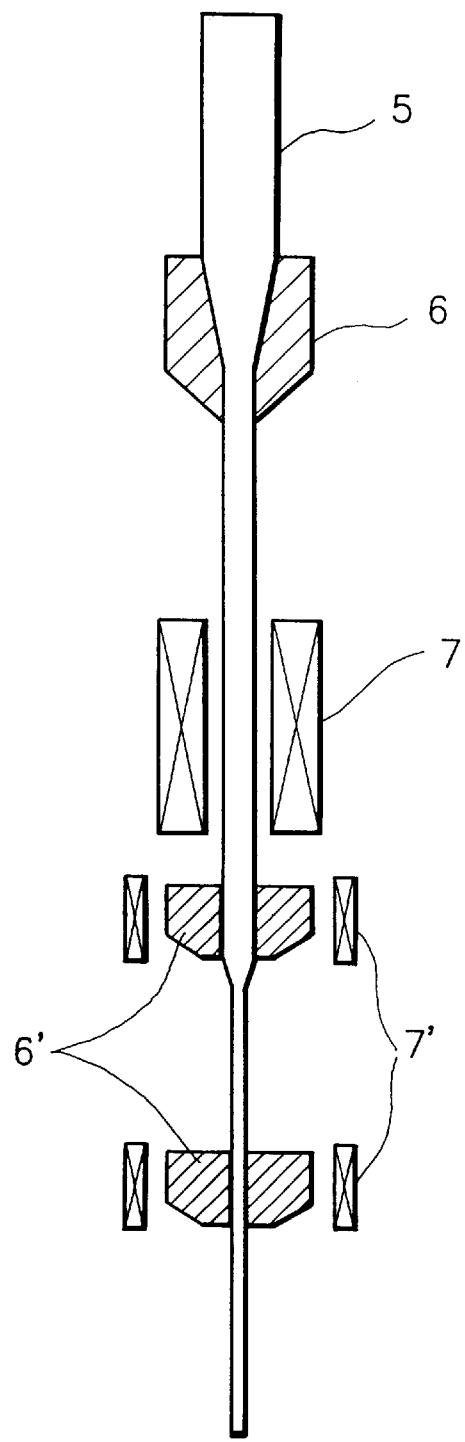
FIG. 2 is a schematic diagram illustrating an example of a process for the production of a sheath-like shaped superconducting wire in the present invention.

The production of a sheath-like shaped superconducting wire shown in FIG. 1(B) may be conducted, for example, in a manner shown in FIG. 2.

The production of the sheath-like shaped superconducting wire in accordance with the manner shown in FIG. 2 is conducted as will be described in the following.

First, there is provided a superconducting wire source 5 comprising a stacked body obtained by providing an electrically conductive hollow tube made of a metal or alloy which has been lined by a metal or ally having a melting point lower than that of the metal or alloy by which the tube is constituted and filling the inside of the hollow tube with an oxide superconductive material. The stacked body as the superconducting wire source 5 is subjected to wire drawing by means of dies 6. In FIG. 2, there is shown that this wire drawing step is conducted once. But if necessary, this wire drawing step may be repeated several times.

The wire-drawn stacked body obtained as a result of the wire drawing step by means of the dies 6 is subjected to heat treatment by means of a heater 7, wherein the metal or alloy lined to the inner wall face of the hollow tube is fused. Then, while heating the stacked body thus treated by means of heaters 7', it is subjected to further wire drawing by means of dies 6', wherein the stacked body is made to be into a fine line as a superconducting wire. The processing temperature T upon conducting this step of making the stacked body into a fine line as a superconducting wire should be properly determined depending upon the melting point T1 of the metal or alloy lined to the inner wall face of the hollow tube and the softening temperature of the metal or alloy constituting the hollow tube. However, in general, the processing temperature T is determined within a range of satisfying the equation: $T1 \geq T \geq 1/5 \times T1$.

In the manner shown in FIG. 2, the metal or alloy (indicated by numeral reference 3 in FIG. 1(B)) lined to the inner wall face of the hollow tube (indicated by numeral reference 2 in FIG. 1(B)) is fused to impregnate in the grain boundaries of the oxide superconductive material (indicated by numeral reference 1 in FIG. 1(B)) while impregnating or/and dispersing into the crystal grains of the oxide superconductive material whereby the gaps (indicated by numeral reference 4 in FIG. 1(B)) present among the crystal grains in the oxide superconducting material are filled with the metal or alloy as shown in FIG. 1(B). As a result, not only the crystal grains of the oxide superconductive material are sufficiently immobilized but also the oxide superconductive material is well fixed with the hallow tube as the substrate with a sufficient contact. By this, the resultant superconducting wire excels particularly in mechanical strength.

The production of a tape-like shaped superconducting wire shown in FIG. 1(A) may be conducted, for example, in the following manner.

That is, first, there is prepared a stacked body having a three-layered structure as shown in FIG. 1(A) by forming an oxide superconductor layer 1 containing crystal grains with gaps 4 among the crystal grains and an electrically conductive material layer 3 composed of a given metal or alloy in the named order on a tape-like shaped electrically conductive substrate 2 composed of a given metal or alloy having a melting point which is higher than that of the metal or alloy by which the electrically conductive material 3.

The stacked body thus prepared is subjected to heat treatment in order to fuse the electrically conductive material layer 3, wherein the electrical conductive material layer 3 is fused to impregnate in the oxide superconductor layer 1 while filling the gaps 4 among the crystal grains contained in the oxide superconductor layer 1 as shown in FIG. 1(A).

The resultant obtained is subjected to forming treatment by way of rolling or the like at a predetermined temperature and under predetermined environmental condition to obtain a tape-like shaped superconducting wire.

As for the heating manner employed upon conducting the heat fusion for the metal or alloy as the electrically conductive material which is substantially not reactive with the oxide superconductor and has a relatively low melting point or upon conducting the wire-drawing processing by means of dies or by way of rolling, there is not a particular limitation. It may be a proper heating manner such as heating by means of a heater, laser irradiation heating, high frequency heating, or the like.

To charge the hollow tube with the oxide superconductor may be conducted by a conventional charging manner.

The formation of the oxide superconductor layer on the tape-like shaped substrate may be conducted by means of a proper manner such as coating process or film deposition process. The formation of the electrically conductive material layer on the oxide superconductor layer may be conducted by a proper manner such as coating process, pressure lamination process, or film deposition process.

Description will be made of the oxide superconductor used in the present invention.

The oxide superconductor usable in the present invention can include any oxide superconductors such as Y—Ba—Cu—O series superconductors, Bi—Sr—Ca—Cu—O series superconductors, T1—Ba—Ca—Cu—O series superconductors, and Hg—Ba—Ca—Cu—O series superconductors.

Of these oxide superconductors, particularly preferable examples are those which will be described below.

(1) Oxide superconductors represented by the composition formula: $Ln_a Sr_b Cu_{3-x} M_x O_c$, where Ln is one or more kinds of an element or atomic group selected from the group consisting of Y and lanthanides; M is one or more kinds of an element or atomic group selected from the group consisting of Ti, V, Ga, Mo, W and Re; 2.7 a+b 3.3; $0.8 \geq a \geq 1.2$; $6 \geq c \geq 9$; and $0.05 \geq x \geq 0.7$.

(2) Oxide superconductors represented by the composition formula: $Ln_aCa_bSr_c Cu_{3-x}M_xO_d$ where Ln is one or more kinds of an element or atomic group selected from the group consisting of Y and lanthanides; M is one or more kinds of an element or atomic group selected from the group consisting of Fe, Co, Ti, V, Ge, Mo, W and Re; $2.7 \geq a+b+c \geq 3.3$; $0.8 \geq a+b \geq 2.1$; $6 \geq d \geq 9$; $0.05 \geq b \geq 1.1$; and $0.05 \geq x \geq 1.10$.

(3) Oxide superconductors represented by the composition formula: $Ln_aCa_bSr_cBa_dCu_{2+e}O_{6+f}C_g$, where Ln is one or more kinds of an element or atomic group selected from the group consisting of Y and lanthanides; $a+b+c=3$; $0.2 \geq a \geq 0.8$; $0.2 \geq b \geq 1.0$; $0.5 \geq c \geq 2.2$; $0 \geq d \geq 1.6$; $0 \geq e \geq 0.8$; $0 < f < 2$; and $0.2 \geq g \geq 1$.

(4) Oxide superconductors represented by the composition formula: $(Ln_{1-a}Ca_a)(Sr_{2-b}Ba_b)(Cu_{3-c}B_c)O_d$, where Ln is one or more kinds of an element or atomic group selected from the group consisting of Y and lanthanides (excluding Ce and Tb); $0.1 \geq a \geq 0.5$; $0.7 \geq b \geq 1.7$; $0.1 \geq c \geq 0.5$; and $6.5 \geq d \geq 7.5$.

(5) Oxide superconductors composed of Ln, M, Ba, Ti, Cu, and O, with Ln being one or more kinds of an element or atomic group selected from the group consisting of Y, La, Pr, Nd, Sm, Eu, Gd, Dy, Ho, Er, Tm, Yb, and Lu; M being one or more kinds of an element or atomic group selected from the group consisting of Ca and Sr, in which the basic constitution comprises an octahedron or pyramidal pentahedron provided by Cu and O and an octahedron provided by Ti and O which are two-dimensionally arranged.

Any of the above-mentioned oxide superconductors may contain an impurity in a slight amount.

In the present invention, the electrically conductive material by which the hollow tube or the tape-like shaped member as the substrate for a superconducting wire may be a proper electrically conductive material as long as it is greater than the oxide superconductor in terms of carrier density and it has a melting point which is higher than the deoxygenation temperature of the oxide superconductor. Specific examples of such electrically conductive material are metals such as Au, Ag, Al, Cu, Ni, Pd, Pt, Ti, Mo, W, Nb and Mn and alloys of these metals.

The hollow tube as the substrate for a super conducting wire in the present invention m ay be a double tube obtained by laminating two hollow tubes respectively made of a different metallic material or by laminating two plates respectively made of a different metallic material and forming the resultant laminate into a hollow tube.

In any case, the substrate for a superconducting wire in the present invention may be designed such that the face thereof to be contacted with the oxide superconductor has a layer composed of a material which is approximate to the oxide superconductor in terms of crystal lattice constant or coefficient of thermal conductivity.

As for the electrically conductive material to be heat-fused and impregnated in the oxide superconductor in the present invention, it may be a proper electrically conductive material as long as it has a point which is lower than the melting point or decomposition temperature of the oxide superconductor and it is substantially not reactive with the oxide superconductor. Specific example of such electrically conductive material are metals such as Ag, Au, and In, and alloys of these metals.

As for the thickness of the electrically conductive layer 3 in the superconducting wire according to the present invention, it should be properly determined in relation to the oxide superconductor layer 1. However, in general, the electrically conductive material layer 3 is desired to be of a thickness which is 0.1 to 1000 times the average thickness of the oxide superconductor layer 1 or is corresponding to 10 to 5000 wt. % of the weight amount of the oxide superconductor layer 1.

If necessary, the superconducting wire according to the present invention may be provided with a reinforcing member or/and an insulating member in order to further improve the mechanical strength thereof. To provide the superconducting wire with these members may be conducted by a conventional manner.

Further, in the superconducting wire according to the present invention, if necessary, the face of the substrate in contact with the oxide superconductor layer may be provided with one or more layers composed of a metal oxide such as $ZrO_2$, MgO, or the like which is approximate to the oxide superconductor in terms of crystal lattice constant or coefficient of thermal conductivity.

In the following, the present invention will be described in more detail with reference to examples. It should be understood that these examples are only for the illustrative purposes but are not intended to restrict the scope of the present invention to these examples.

EXAMPLE 1

In this example, there was prepared a superconducting wire of the configuration shown in FIG. 1(A).

As previously described, a superconducting wire of the configuration shown in FIG. 1(A) is in the form of a tape-like shape. The superconducting wire comprises a tape-like shaped electrically conductive substrate 2, a layer 1 composed of an oxide superconductor staked on said substrate 2, and a metal layer 3 stacked on said layer 1, said metal layer 3 being composed of a metal having a melting point which is lower than the melting point of the substrate 2 and is lower than the decomposition temperature of the oxide superconductor layer 1. The substrate 2 is composed of an alloy having a melting point which is higher than the melting point of the metal layer 3 and is higher than the decomposition temperature of the oxide superconductor layer 2.

Now, the tape-like shaped superconducting wire was prepared in a manner comprising the steps (A) to (D) shown in FIG. 3.

Figure 3A:
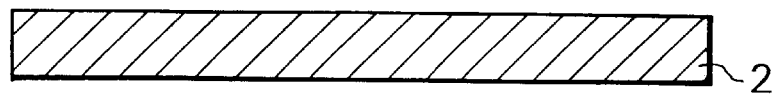
FIGS. 3(A) through 3(D) are schematic views for explaining an example of a process for the production of a tape-like shaped superconducting wire in the present invention.

In a first step (that is, the step (A) shown in FIG. 3(A)), there was provided a tape-like shaped electrically conductive substrate 2 made of a silver alloy containing 5 wt. % of palladium.

Figure 3B:
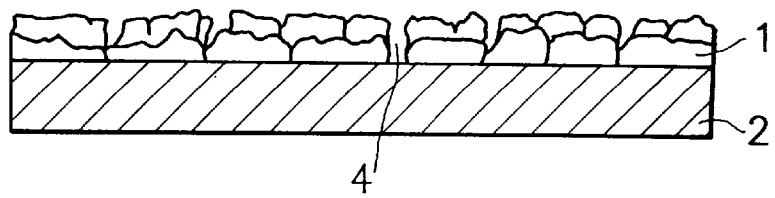

In a second step (that is, the step (B) shown in FIG. 3(B)), there was provided a composition comprising $YSr_2Cu_{2.8}W_{0.2}y$ containing $SrY_2O_4$ in an amount of 10 wt. %, having A critical temperature of 80 K, as an oxide superconductor in order to form an oxide superconductor layer 1 on the substrate 2.

The formation of the oxide superconductor layer 1 on the substrate 2 herein may be conducted by a coating process or a proper film deposition process.

In this example, the formation of the oxide superconductor layer was conducted by the coating process. Particularly, the above composition comprising $YSr_2Cu_{2.8}W_{0.2}O_y$ containing $SrY_2O_4$ in an amount of 10 wt. % was applied on the substrate 2 by means of the coating process, followed by heat treatment, to thereby form the oxide superconductor layer 1 containing crystal grains with gaps 4 among the crystal grains on the substrate 2.

Figure 3C:
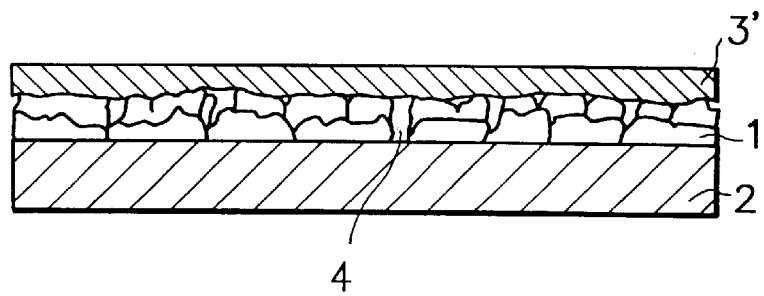

In a third step (that is, the step (C) shown in FIG. 3(C)), an Ag film 3' was formed on the oxide superconductor layer 1 by means of a conventional electron beam deposition process at a thickness which is about 100 times the average thickness of the oxide superconductor layer 1.

Figure 3D:
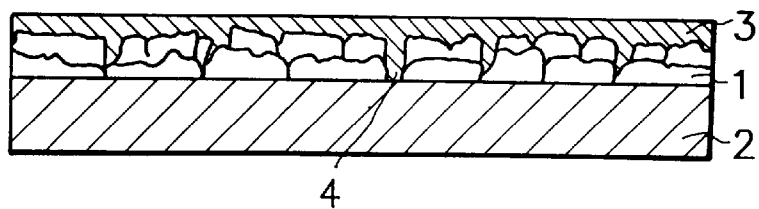

In a fourth step (that is, the step (D) shown in FIG. 3(D)), the stacked body obtained in the fourth step was placed in a conventional electric furnace, wherein the Ag film formed on the oxide superconductor layer was subjected to heat fusion in an atmosphere composed of oxygen gas, whereby the Ag film was fused to impregnate in the oxide superconductor layer. By this, there was formed an electrically conductive material layer 3 on the oxide superconductor layer 1.

The heat fusion of the Ag film in this case may be conducted by means of $CO_2$ laser irradiation heating or high frequency heating.

After the formation of the electrically conductive material layer 3, the the stacked body was taken out from the electric furnace and it was gradually cooled in an atmosphere maintained at room temperature.

Thus, there was obtained a tape-like shaped superconducting wire having a long length.

In the fourth step, the Ag film is fused and flown in the oxide superconductor layer such that the fused Ag is impregnated in the oxide superconductor layer while filling the gaps 4 among the crystal grains in the oxide superconductor layer to reach the interface between the superconductor layer 1 and the substrate 2 as shown in FIG. 3(D), and after this, the stacked body is cooled, wherein the fused Ag impregnated in the oxide superconductor layer is solidified. Because of this, the electrically conductive material layer 3 (composed of Ag in this example) functions to immobilize the crystal grains in the superconductor layer 1 and also functions to prevent the superconductor layer 1 from being removed from the substrate 1.

COMPARATIVE EXAMPLE 1

The procedures of Example 1 were repeated, except that the procedures of forming the electrically conductive material layer 3 were not conducted, to thereby obtain a comparative tape-like shaped superconducting wire having a long length.

EVALUATION

Using each of the superconducting wire obtained in Example 1 and the comparative superconducting wire obtained in Comparative Example 1, there were prepared three coils, i.e., a coiled superconducting wire with a diameter of 10 cm, a coiled superconducting wire with a diameter of 20 cm, and a coiled superconducting wire with a diameter of 30 cm.

Then, at opposite ends of each coiled superconducting wire, there were fixed terminals for the energization and voltage measurement. And electric current was flown through each coiled superconducting wire while maintaining the coiled superconducting wire in a state of being cooled to 77 K, wherein the voltage generated was measured.

As a result, in the case of any of the three coiled superconducting wires prepared using the superconducting wire obtained in Example 1, a large electric current of more than $10_4/cm^2$ could be flown. On the other hand, as for the three comparative coiled superconducting wires prepared using the comparative superconducting wire obtained in Comparative Example 1, in the case of the comparative coiled superconducting wire of 30 cm in diameter, an electric current of at most about $10^3 \text{ A/cm}^2$ could be flown, but in the case of each of the remaining comparative coiled superconducting wires, an electric current of more than $10^2$ A/cm² could not be flown.

Based on the evaluated results, it was found that the superconducting wire obtained in Example 1 belonging to the present invention is surpassing the comparative superconducting wire obtained in Comparative Example 1 not only in terms of resistance to mechanical deformation but also in terms of the characteristics required for a superconducting wire.

EXAMPLE 2

In this example, there was prepared a superconducting wire of the configuration shown in FIG. 1(B).

As previously described, the superconducting wire of the configuration shown in FIG. 1(B) comprises a hollow tube 2 made of a given metallic material in which an oxide superconductor 1 is charged, wherein gaps 4 among the crystal grains in the oxide superconductor 1 are filled with a given metallic material as an electrically conductive material 3, having a melting point which is lower than that of the metallic material by which the hollow tube 2 is constituted and is also lower than the decomposition temperature of the oxide superconductor 1.

Figure 4A:
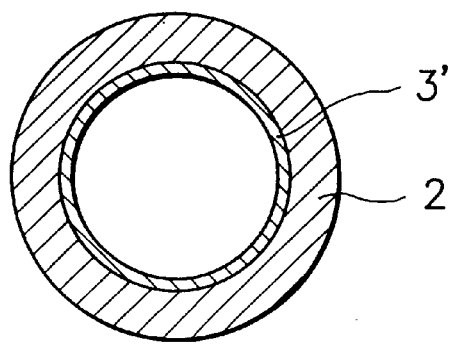
FIGS. 4(A) through 4(C) are schematic views for explaining an example of a process for the production of a sheath-like shaped superconducting wire in the present invention.
Figure 4B:
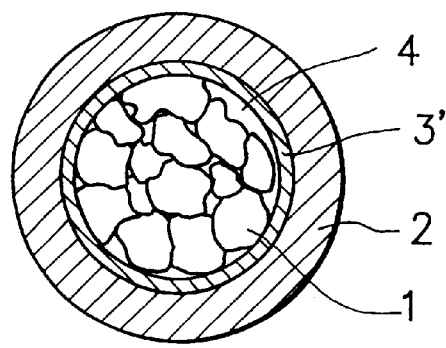
Figure 4C:
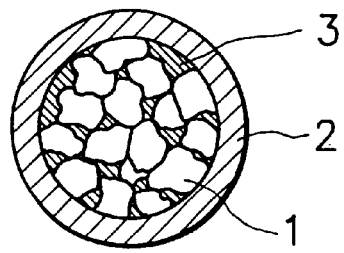

The sheath-like shaped superconducting wire was prepared in a manner comprising the steps (A) to (C) shown in FIGS. 4(A) to 4(C).

In a first step (that is, the step (A) shown in FIG. 4(A)), there was provided a hollow tube 2 made of a silver alloy containing 40 wt. % of palladium as a substrate for an oxide superconducting wire.

At the inner wall face of the hollow tube 2, there was deposited an Ag film 3' as a lining (which will eventually become an electrically conductive layer 3 shown in FIG. 4(C)) by a conventional vacuum deposition process. By this, there was obtained a double-layered hollow tube having a core space as shown in FIG. 4(A).

In a second step (that is, the step (B) shown in FIG. 4(B)), the core space of the double-layered hollow tube was charged with a composition comprising $YSr_2Cu_{2.8}W_{0.2}O_y$, containing $SrY_2O_4$ in an amount of 10 wt. % as an oxide superconductor 1 to obtain a stacked body, wherein the oxide superconductor 1 charged in the core space of the double-layered hollow tube has gaps 4 among the crystal grains contained in the oxide superconductor as shown in FIG. 4(B).

In the above first step, the Ag film 3 lined to the inner wall face of the hollow tube 2 was made to have a thickness corresponding to about 500 wt. % of the weight amount of the oxide super conductor 1 charged in the core space of the double-layered hollow tube.

In a third step (that is, the step (C) shown in FIG. 4(C)), the stacked body obtained in the second step was subjected to plasticity processing by way of heat fusion through dies while wire-drawing the stacked body, followed by cooling to room temperature, to thereby obtain a sheath-like shaped superconducting wire having a long length.

In the third step, the Ag film 3' as the lining of the double-layered hollow tube is fused to provide an Ag layer 3 (as an electrically conductive material layer) impregnated in the oxide superconductor layer 1 to fill the gaps 4 among the crystal grains contained in the oxide superconductor 1 while reaching the interface between the superconductor layer 1 and the layer 2 of the hollow tube (as the substrate) as shown in FIG. 4(C), and after this, the stacked body is cooled, wherein the Ag layer 3 impregnated in the oxide superconductor layer is solidified. Because of this, the electrically conductive material layer 3 (composed of Ag) functions to immobilize the crystal grains in the superconductor layer 1 and also functions to prevent the superconductor layer 1 from being removed from the substrate 1.

COMPARATIVE EXAMPLE 2

The procedures of Example 2 were repeated, except that the procedures of forming the electrically conductive material layer 3 were not conducted, to thereby obtain a comparative sheath-like shaped superconducting wire having a long length.

EVALUATION

Using each of the superconducting wire obtained in Example 2 and the comparative superconducting wire obtained in Comparative Example 2, there were prepared three coils, i.e., a coiled superconducting wire with a diameter of 10 cm, a coiled superconducting wire with a diameter of 20 cm, and a coiled superconducting wire with a diameter of 30 cm.

Then, at opposite ends of each coiled superconducting wire, there were fixed terminals for the energization and voltage measurement. And electric current was flown through each coiled superconducting wire while maintaining the coiled superconducting wire in a state of being cooled to 77 K, wherein the voltage generated was measured.

As a result, in the case of any of the three coiled superconducting wires prepared using the superconducting wire obtained in Example 2, a large electric current of more than $10^4$ A/cm$^2$ could be flown. On the other hand, as for the three comparative coiled superconducting wires prepared using the comparative superconducting wire obtained in Comparative Example 2, in the case of the comparative coiled superconducting wire of 30 cm in diameter, an electric current of at most about $10^3$ A/cm$^2$ could be flown, but in the case of each of the remaining comparative coiled superconducting wires, an electric current of more than $10^2$ A/cm$^2$ could not be flown.

Based on the evaluated results, it was found that the superconducting wire obtained in Example 2 belonging to the present invention is surpassing the comparative superconducting wire obtained in Comparative Example 2 not only in terms of resistance to mechanical deformation but also in terms of the characteristics required for a superconducting wire.

EXAMPLE 3

In this example, there was prepared a superconducting wire of the configuration shown in FIG. 1(A).

As previously described, a tape-like shaped superconducting wire shown in FIG. 1(A) may be prepared, for example, in a manner comprising the steps (A) to (D) shown in FIGS. 3(A) to 3(D). That is, an electrically conductive substrate 2 in the form of a tape-like shape is provided (see, FIG. 3(A)), an oxide superconductor layer 1 containing crystal grains with gaps 4 among the crystal grains is formed on the substrate 2 (see, FIG. 3(B)), and a layer 3' composed of a metallic material (that is, an electrically conductive material) having a melting point which is lower than the melting point of the substrate 2 and is lower than the decomposition temperature of the oxide superconductor layer 1 is formed on the oxide superconductor layer 1 to obtain a stacked body (see, FIG. 3(C). The formation of each of the oxide superconductor layer 1 and the metallic material layer 3' may be conducted by a coating process or a film deposition process. It is possible for the substrate 2 to be designed such that the face thereof to be contacted with the oxide superconductor layer 1 has a layer composed of a material which is approximated to the oxide superconductor layer 1 in terms of crystal lattice constant or coefficient of thermal conductivity. The foregoing stacked body is subjected to heat treatment using an electric furnace or by way of laser irradiation heating or high frequency heating, wherein there is afforded an electrically conductive layer 3 as a result of the metallic layer 3' having been fused to gravitationally impregnate in the oxide superconductor layer 1 while filling the gaps 4 among the crystal grains in the oxide superconductor layer 1 and while reaching the interface between the substrate 2 and the oxide superconductor layer 1 (see, FIG. 3(D)), wherein the crystal grains in the oxide superconductor layer 1 are immobilized in a desirable state and the oxide superconductor layer 1 is well fixed to the substrate so that the oxide superconductor layer is hardly removed from the substrate. In this step, in order to facilitate the impregnation of the fused metallic material in the oxide superconductor layer, it is possible to use vibration. And after the heat treatment for the metallic material layer, the resultant may be subjected to forming treatment by way of rolling or the like. Thus, there can be obtained a superconducting wire. As for the superconducting wire, it is possible to provide an insulating member or a reinforcing member at the exterior thereof.

Now, in this example, there was prepared a tape-like shaped superconducting wire in the following manner.

In a first step (that is, the step (A) shown in FIG. 3(A)), there was provided a tape-like shaped electrically conductive substrate 2 made of a silver alloy containing 10 wt. % of palladium.

In a second step (that is, the step (B) shown in FIG. 3(B)), there was provided a composition comprising $YSr_2Cu_{2.8}W_{0.2}O_y$ containing $SrY_2O_4$ in an amount of 5 wt. %, having a critical temperature of 80 K, as an oxide superconductor in order to form an oxide superconductor layer 1 on the substrate 2. This composition was applied on the substrate 2 by means of a conventional coating process, followed by heat treatment, to thereby form an oxide superconductor layer 1 containing crystal grains with gaps 4 among the crystal grains on the substrate 2.

In a third step (that is, the step (C) shown in FIG. 3(C)), an Ag film 3' was formed on the oxide superconductor layer 1 by means of a conventional electron beam deposition process at a thickness which is about 150 times the average thickness of the oxide superconductor layer 1.

In a fourth step (that is, the step (D) shown in FIG. 3(D)), the stacked body obtained in the fourth step was placed in a conventional electric furnace, wherein the Ag film formed on the oxide superconductor layer was subjected to heat fusion in an atmosphere composed of oxygen gas, whereby the Ag film was fused to impregnate in the oxide superconductor layer. By this, there was formed an electrically conductive material layer 3 on the oxide superconductor layer 1.

After the formation of the electrically conductive material layer 3, the the stacked body was taken out from the electric furnace and it was gradually cooled in an atmosphere maintained at room temperature.

Thus, there was obtained a tape-like shaped superconducting wire having a long length.

In the fourth step, the Ag film is fused and flown in the oxide superconductor layer such that the fused Ag is impregnated in the oxide superconductor layer while filling the gaps among the crystal grains in the oxide superconductor layer to reach the interface between the superconductor layer 1 and the substrate 2 as shown in FIG. 3(D), and after this, the stacked body is cooled, wherein the fused Ag impregnated in the oxide superconductor layer is solidified. Because of this, the electrically conductive material layer 3 (composed of Ag in this example) functions to immobilize the crystal grains in the superconductor layer 1 and also functions to prevent the superconductor layer 1 from being removed from the substrate 1.

COMPARATIVE EXAMPLE 3

The procedures of Example 3 were repeated, except that the procedures of forming the electrically conductive material layer 3 were not conducted, to thereby obtain a comparative tape-like shaped superconducting wire having a long length.

EVALUATION

From each of the superconducting wire obtained in Example 3 and the comparative superconducting wire obtained in Comparative Example 3, there was obtained a superconducting wire sample of 30 cm in length. As for each superconducting wire sample, at opposite ends thereof, there were fixed terminals for the energization and voltage measurement, wherein the terminals for the voltage measurement were arranged at an interval of 28 cm. One end of the superconducting wire sample was fixed, and the remaining end thereof was forced to move up and down at a distance of 1 cm to deform the superconducting wire sample. This deformation process was repeated 100 times. Thereafter, electric current was flown through the superconducting wire sample while maintaining it in a state of being cooled to 77 K, wherein the quantity of electric current flown to provide 0.2 $\mu V$ was measured.

As a result, in the case of the superconducting wire obtained in Example 3, a large electric current of more than $10^4$ A/cm$^2$ could be flown. On the other hand, in the case of the comparative superconducting wire obtained in Comparative Example 3, only an electric current of at most $10^3$ A/cm$^2$ could be flown.

Based on the evaluated results, it was found that the superconducting wire obtained in Example 3 belonging to the present invention is surpassing the comparative superconducting wire obtained in Comparative Example 3 not only in terms of resistance to mechanical deformation but also in terms of the characteristics required for a superconducting wire.

EXAMPLE 4

In this example, there was prepared a superconducting wire of the configuration shown in FIG. 1(B).

As previously described, a sheath-like shaped superconducting wire shown in FIG. 1(B) may be prepared, for example, in a manner comprising the steps (A) to (C) shown in FIGS. 4(A) to 4(C). That is, first, there is provided a hollow tube 2 made of a given metallic material, and a layer 3' composed of a metallic material having a lower melting point than that of the metallic material by which the hollow tube 2 is constituted is lined to the inner face of the hollow tube such that the hollow tube has a core space, to obtain a double-layered hollow tube having a core space (see, FIG. 4(A)). Other than this, the double-layered hollow tube may be obtained by laminating two hollow tubes respectively made of a given different metallic material or by laminating two plates respectively made of a given different metallic material and forming the resultant laminate into a hollow tube. Then, the core space of the double-layered hollow tube is charged with an oxide superconductor 1 containing crystal grains with gaps 4 among the crystal grains to obtain a stacked body as a superconducting wire-forming source (see, FIG. 4(B)). As shown in FIG. 2, the stacked body as the superconducting wire-forming source is subjected to wire-drawing treatment by means of dies 6, followed by subjecting to heat treatment by means of a heater 7, wherein the metallic material layer 3' thereof is heated at a higher temperature than the melting point of the metallic material layer to fuse the metallic material layer such that the fused metallic material impregnates in the oxide superconductor 1 while filling the gaps among the crystal grains in the oxide superconductor. Prior to cooling the fused metallic material impregnated in the oxide superconductor to room temperature, wire-drawing treatment is desired to be conducted at least twice while maintaining the stacked body at a desired temperature which is lower than the melting point of the metallic material of the metallic material layer. The temperature employed in this case is somewhat different depending upon the kind of each of the constituent materials of the superconducting wire-forming source. However, in general, it is desired to be made such that the first wire-drawing treatment after the heat-fusion treatment is conducted at a temperature at which the metallic material layer becomes to be in a partially fused state and the second wire-drawing treatment is conducted at a lower temperature than the melting point of the metallic layer and at which the fused metallic material can be solidified and it can be readily engaged in plasticity processing. Thereafter, if necessary, further wire-drawing treatment, heat treatment and the like may be conducted. Thus, there is obtained a sheath-like shaped superconducting wire of the configuration shown in FIG. 4(C). In the superconducting wire, the metallic material layer as the lining of the double-layered hollow tube is fused to provide an electrically conductive material layer 3 impregnated in the oxide superconductor layer 1 to fill the gaps 4 among the crystal grains contained in the oxide superconductor 1 while reaching the interface between the superconductor layer 1 and the layer 2 of the hollow tube (as the substrate) as shown in FIG. 4(C), and after this, the stacked body is cooled, wherein the metallic material layer 3 impregnated in the oxide superconductor layer is solidified. Because of this, the electrically conductive material layer 3 functions to immobilize the crystal grains in the superconductor layer 1 and also functions to prevent the superconductor layer 1 from being removed from the substrate 1.

Now, in this example, there was prepared a sheath-like shaped in the following manner.

In a first step (that is, the step (A) shown in FIG. 4(A)), there was provided a hollow tube 2 made of Ag as a substrate for an oxide superconducting wire.

At the inner wall face of the hollow tube 2, there was deposited a film 3' composed of an Ag alloy containing 26 wt. % of Cu and 2 wt. % of Ni as a lining (which will eventually become an electrically conductive layer 3 shown in FIG. 4(C)) by a conventional vacuum deposition process. By this, there was obtained a double-layered hollow tube having a core space as shown in FIG. 4(A).

In a second step (that is, the step (B) shown in FIG. 4(B)), the core space of the double-layered hollow tube was charged with a composition comprising Bi:Pb:Sr:Ca:Cu= 1.6:0.4:1.6:2:2.8 as an oxide superconductor 1 to obtain a stacked body as a superconducting wire-forming source, wherein the oxide superconductor 1 charged in the core space of the double-layered hollow tube has gaps 4 among the crystal grains contained in the oxide superconductor as shown in FIG. 4(B).

In the above first step, the Ag alloy film 3' lined to the inner wall face of the hollow tube 2 was made to have a thickness corresponding to about 500 wt. % of the weight amount of the oxide super conductor 1 charged in the core space of the double-layered hollow tube.

In a third step (that is, the step (C) shown in FIG. 4(C)), the stacked body obtained in the second step was subjected to heat treatment at a temperature in the range of 780° C. to 790° C. wherein the Ag alloy film of the stacked body was heat-fused, followed by subjecting to wire-drawing treatment by means of dies at a temperature of 777° C. and further wire-drawing treatment by means of dies at 350° C., and the resultant was cooled to room temperature, followed by subjecting to processing by means of dies, whereby a sheath-like shaped superconducting wire was obtained.

In the third step, the Ag alloy film 3' as the lining of the double-layered hollow tube is fused to provide an Ag alloy layer 3 (as an electrically conductive material layer) impregnated in the oxide superconductor layer 1 to fill the gaps 4 among the crystal grains contained in the oxide superconductor 1 while reaching the interface between the superconductor layer 1 and the layer 2 of the hollow tube (as the substrate) as shown in FIG. 4(C), and after this, the stacked body is cooled, wherein the Ag layer 3 impregnated in the oxide superconductor layer is solidified. Because of this, the Ag alloy layer 3 functions to immobilize the crystal grains in the superconductor layer 1 and also functions to prevent the superconductor layer 1 from being removed from the substrate 1.

COMPARATIVE EXAMPLE 4

The procedures of Example 4 were repeated, except that the heat fusion treatment and the twice wire-drawing treatments after the heat fusion treatment were not conducted, to thereby obtain a comparative sheath-like shaped superconducting wire having a long length.

EVALUATION

From each of the superconducting wire obtained in Example 4 and the comparative superconducting wire obtained in Comparative Example 4, there were obtained a plurality of superconducting wire samples of 10 cm in length. As for each superconducting wire sample, at opposite ends thereof, there were fixed terminals for the energization and voltage measurement, wherein the terminals for the voltage measurement were arranged at an interval of 8 cm. One end of the superconducting wire sample was fixed. Then, electric current was flown through the superconducting wire sample while maintaining it in a state of being cooled to 77 K, wherein the quantity of electric current flown to provide 0.2 $\mu$V was observed. Thereafter, the temperature of the superconducting wire sample was raised to room temperature, and one end thereof was fixed and the remaining end thereof was forced to move up and down at a distance of 0.5 cm to deform the superconducting wire sample. This deformation process was repeated 10 times for some of the superconducting wire samples, 100 times for some of the superconducting wire samples, 200 times for some of the superconducting wire samples, and 300 times for some of the superconducting wire samples. Thereafter, electric current was flown through each superconducting wire sample thus treated while maintaining it in a state of being cooled to 77 K, wherein the quantity of electric current flown to provide 0.2 $\mu$V was observed.

As a result, in the case of the superconducting wire obtained in Example 4, even as for any of the superconducting wire samples having been subjected to the 300 times deformation cycles, a large electric current of more than $10^4$ A/cm$^2$ could be flown. On the other hand, in the case of the comparative superconducting wire obtained in Comparative Example 3, as for the superconducting wire sample not having been subjected to the deformation treatment, an electric current of about $10^4$ A/cm$^2$ could be flown, but in the case where the deformation treatment was conducted, a reduction was occurred in the quantity of electric current flown. Particularly, as for the comparative superconducting wire samples having been subjected to the 10 times deformation cycles, the proportion of those in which an electric current of about $10^4$ A/cm$^2$ could be flown was only 5%. As for the comparative superconducting wire samples having been subjected to the 200 times deformation cycles and to the 300 times deformation cycles, only an electric current of at most $10^2$ A/cm$^2$ could be flown.

Based on the evaluated results, it was found that the superconducting wire obtained in Example 4 belonging to the present invention is surpassing the comparative superconducting wire obtained in Comparative Example 4 not only in terms of resistance to mechanical deformation but also in terms of the characteristics required for a superconducting wire.

What is claimed is:

1. A process for producing a superconducting wire, said process comprising the steps of:

(i) providing a stacked body comprising (a) a substrate composed of (a-i) an electrically conductive material, (b) an oxide superconductor material having a desired decomposition temperature and (c) an electrically conductive material which is substantially not reactive with said oxide superconductor material (b), said electrically conductive material (c) having a melting point which is lower than that of said electrically conductive material (a-i) of said substrate (a) and which is lower than said decomposition temperature of said oxide superconductor material (b), and said stacked body having a structure in which said substrate (a) is shaped in a hollow tubular form whose inner wall face is covered by said electrically conductive material (c) and whose inside space is filled with said oxide superconductor material (b);

(ii) subjecting said stacked body to heat treatment to heat-fuse said electrically conductive material (c) of said stacked body to thereby impregnate said electrically conductive material (c) into said oxide superconductor material (b) of said stacked body such that gaps among crystal grains contained in said oxide superconductor material (b) are filled with said electrically conductive material (c); and (iii) subjecting a product obtained in said step (ii) to wire-drawing treatment at a temperature at which said electrically conductive material (c) becomes partially fused, or at a higher temperature, wherein said step (iii) can be conducted simultaneously with or after said step (ii).

2. The process according to claim 1, wherein the electrically conductive material (c) is a metal and the electrically conductive material (a-i) of the substrate (a) is an alloy containing said metal.

3. The process according to claim 1, wherein the electrically conductive material (a-i) of the substrate (a) is a metal and the electrically conductive material (c) is an alloy containing said metal.

4. The process according to claim 1, wherein the electrically conductive material (c) is Ag and the electrically conductive material (a-i) of the substrate (a) is an Ag-containing alloy.

5. The process according to claim 1, wherein the electrically conductive material (a-i) of the substrate (a) is Ag and the electrically conductive material (c) is an Ag-containing alloy.

6. A process for producing a superconducting wire, said process comprising the steps of:
(i) providing a stacked body comprising (a) a substrate composed of (a-i) an electrically conductive material, (b) an oxide superconductor material having a desired decomposition temperature and (c) an electrically conductive material that is substantially not reactive with said oxide superconductor material (b), said electrically conductive material (c) having a melting point that is lower than that of said electrically conductive material (a-i) of said substrate (a) and that is lower than said decomposition temperature of said oxide superconductor material (b), and said stacked body having a structure in which said substrate (a) is tape-like shaped, said electrically conductive material (c) is tape-like shaped, and said oxide superconductor material (b) is interposed between said tape-like shaped substrate (a) and said tape-like shaped electrically conductive material (c); and
(ii) arranging said stacked body such that said tape-like shaped electrically conductive material (c) is situated topmost and subjecting said stacked body to heat treatment to heat-fuse said electrically conductive material (c) of said stacked body to thereby impregnate said electrically conductive material (c) into said oxide superconductor material (b) of said stacked body such that gaps among crystal grains contained in said oxide superconductor material (b) are filled with said electrically conductive material.

7. The process according to claim 6, wherein the electrically conductive material (a) is a metal and the electrically conductive material (a-i) of the substrate (a) is an alloy containing said metal.

8. The process according to claim 6, wherein the electrically conductive material (a-i) of the substrate (a) is a metal and the electrically conductive material (c) is an alloy containing said metal.

9. The process according to claim 6, wherein the electrically conductive material (c) is Ag and the electrically conductive material (a-i) of the substrate (a) is an Ag-containing alloy.

10. The process according to claim 6, wherein the electrically conductive material (a-i) of the substrate (a) is Ag and the electrically conductive material (c) is an Ag-containing alloy.

11. The process according to claim 6 further comprising a step of subjecting said superconducting wire to wire drawing treatment to shape said superconducting wire into a fine wire form.

12. A process for producing a superconducting article, said process comprising the steps of:
(i) providing a stacked body comprising (a) a substrate composed of (a-i) an electrically conductive material, (b) an oxide superconductor material having a desired decomposition temperature and (c) an electrically conductive material which is substantially not reactive with said oxide superconductor material (b), said electrically conductive material (c) having a melting point which is lower than that of said electrically conductive material (a-i) of said substrate (a) and which is lower than said decomposition temperature of said oxide superconductor material (b), and said stacked body having a structure in which said substrate (a) is shaped in a hollow tubular form whose inner wall face is covered by said electrically conductive material (c) and whose inside space is filled with said oxide superconductor material (b);
(ii) subjecting said stacked body to heat treatment to heat-fuse said electrically conductive material (c) of said stacked body to thereby impregnate said electrically conductive material (c) into said oxide superconductor material (b) of said stacked body such that gaps among crystal grains contained in said oxide superconductor material (b) are filled with said electrically conductive material (c); and
(iii) subjecting a product obtained in said step (ii) to wire-drawing treatment at a temperature at which said electrically conductive material (c) becomes partially fused, or at a higher temperature, wherein said step (iii) can be conducted simultaneously with or after said step (ii).

13. A process for producing a superconducting article, said process comprising the steps of:
(i) providing a stacked body comprising (a) a substrate composed of (a-i) an electrically conductive material, (b) an oxide superconductor material having a desired decomposition temperature and (c) an electrically conductive material which is substantially not reactive with said oxide superconductor material (b), said electrically conductive material (c) having a melting point which is lower than that of said electrically conductive material (a-i) of said substrate (a) and which is lower than said decomposition temperature of said oxide superconductor material (b), and said stacked body having a structure in which said substrate (a) is tape-like shaped, said electrically conductive material (c) is tape-like shaped, and said oxide superconductor material (b) is interposed between said tape-like shaped substrate (a) and said tape-like shaped electrically conductive material (c); and
(ii) arranging said stacked body such that said tape-like shaped electrically conductive material (c) is situated topmost and subjecting said stacked body to heat treatment to heat-fuse said electrically conductive material (c) of said stacked body to thereby impregnate said electrically conductive material (c) into said oxide superconductor material (b) of said stacked body such that gaps among crystal grains contained in said oxide superconductor material (b) are filled with said electrically conductive material (c).

* * * * *

UNITED STATES PATENT AND TRADEMARK OFFICE
CERTIFICATE OF CORRECTION

PATENT NO.   : 6,381,832 B1
DATED        : May 7, 2002
INVENTOR(S)  : Norio Kaneko It is certified that error appears in the above-identified patent and that said Letters Patent is hereby corrected as shown below:

<u>Title page,</u>
Item [56], References Cited, FOREIGN PATENT DOCUMENTS,
"63241826 should read -- 63-241826
   1276516"                    1-276516 --.
Item [57], ABSTRACT,
Line 10, "And a process for the" should be deleted; and
Line 11, "production of said superconducting wire." should be deleted.

<u>Column 1,</u>
Line 25, "know" should read -- known --;
Line 41, "of a" should read -- a --;
Line 42, "the" should read -- with the --; and
Line 43, "entail" should read -- occur --.

<u>Column 2,</u>
Line 16, "there" should read -- it --;
Line 26, "heat-treatet" should read -- heat-treated --;
Line 34, "remained" should read -- retained --;
Line 46, "but" should read -- nevertheless --; and "entail" should read -- occur --;
Line 48, "to be" should be deleted;
Line 56, "not only" should read -- either --;
Line 58, "but also" should read -- or --; and
Line 65, "such" should read -- such a --.

<u>Column 3,</u>
Line 6, "to greatly varied" should read -- have very irregular --;
Lines 13, 26, 41 and 58, "and" should read -- , --;
Line 22, "exhibits" should read -- exhibits an excellent critical current density, using an oxide --; and
Lines 63, 65 and 66, "tublar" should read -- tubular --.

<u>Column 4,</u>
Line 2, "tublar" should read -- tubular --; and
Lines 13 and 50, "and" should read -- , --.

<u>Column 5,</u>
Lines 36, 38, 39 and 42, "tublar" should read -- tubular --; and
Line 52, "and" should read -- , --.

UNITED STATES PATENT AND TRADEMARK OFFICE
CERTIFICATE OF CORRECTION

PATENT NO. : 6,381,832 B1
DATED : May 7, 2002
INVENTOR(S) : Norio Kaneko

It is certified that error appears in the above-identified patent and that said Letters Patent is hereby corrected as shown below:

Column 6,
Line 36, "occurred" should read -- formed --;
Line 45, "entails" should read -- occurs --; and
Line 49, "flown" should read -- conducted --.

Column 7,
Line 14, "ally" should read -- alloy --.

Column 8,
Line 9, "hallow" should read -- hollow --;
Line 23, "by which" should read -- as --; and
Line 32, "condition" should read -- conditions --.

Column 9,
Line 22, should be deleted;
Line 44, "super conducting" should read -- superconducting --; and
Line 45, "m ay" should read -- may --.

Column 10,
Line 5, "is corresponding" should read -- corresponds --;
Line 35, "staked" should read -- stacked --; and
Line 54, "$W_{0.2}y$" should read -- $W_{0.2}O_y$ --.

Column 11,
Line 27, "flown in" should read -- made to flow onto --;
Line 58, "flown" should read -- conducted --; and
Line 66, "$10_4/cm^2$" should read -- $10^4/cm^2$ --; and "flown." should read -- conducted. --.

Column 12,
Line 4, "flown," should read -- conducted, --; and
Line 7, "flown." should read -- conducted. --.

Column 13,
Line 20, "of the" should be deleted;
Line 30, "And" should read -- An --; and "flown" should read -- conducted --;
Lines 37 and 45, "flown." should read -- conducted. --; and
Line 42, "flown," should read -- conducted, --.

UNITED STATES PATENT AND TRADEMARK OFFICE
CERTIFICATE OF CORRECTION

PATENT NO. : 6,381,832 B1
DATED : May 7, 2002
INVENTOR(S) : Norio Kaneko

It is certified that error appears in the above-identified patent and that said Letters Patent is hereby corrected as shown below:

Column 15,
Line 3, "flown in" should read -- made to flow onto --;
Line 38, "flown" should read -- conducted --;
Lines 44 and 47, "flown." should read -- conducted. --; and
Line 65, "is lined to" should read -- so as to line --.

Column 16,
Line 6, "hallow" should read -- hollow --; and
Line 56, "shaped" should read -- shaped superconducting wire --.

Column 17,
Lines 58 and 61, "flown" should read -- conducted --.

Column 18,
Lines 4, 7 and 22, "flown" should read -- conducted --;
Line 16, "flown," should read -- conducted, --; and
Line 18, "was" should be deleted.

Signed and Sealed this

Fifteenth Day of April, 2003

JAMES E. ROGAN
*Director of the United States Patent and Trademark Office*